United States Patent
Chang et al.

(10) Patent No.: US 12,045,150 B2
(45) Date of Patent: Jul. 23, 2024

(54) METHOD FOR TESTING MEMORY BY BUILT-IN SELF-TEST STORAGE SPACE AND RELATED DEVICE

(71) Applicant: CHANGXIN MEMORY TECHNOLOGIES, INC., Hefei (CN)

(72) Inventors: Heng-Chia Chang, Hefei (CN); Chuanqi Shi, Hefei (CN); Li Ding, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 308 days.

(21) Appl. No.: 17/595,454

(22) PCT Filed: Oct. 15, 2020

(86) PCT No.: PCT/CN2020/121297
§ 371 (c)(1),
(2) Date: Nov. 17, 2021

(87) PCT Pub. No.: WO2021/179602
PCT Pub. Date: Sep. 16, 2021

(65) Prior Publication Data
US 2022/0254437 A1 Aug. 11, 2022

(30) Foreign Application Priority Data
Mar. 11, 2020 (CN) .......................... 202010166643.9

(51) Int. Cl.
*G06F 11/00* (2006.01)
*G06F 11/07* (2006.01)
(Continued)

(52) U.S. Cl.
CPC .......... *G06F 11/27* (2013.01); *G06F 11/0793* (2013.01); *G06F 11/2268* (2013.01)

(58) Field of Classification Search
CPC ............ G06F 11/0787; G06F 11/0793; G06F 11/2268; G06F 11/27; G11C 29/12;
(Continued)

(56) References Cited

U.S. PATENT DOCUMENTS 9,640,279 B1 5/2017 Popps et al.
2003/0107926 A1 6/2003 Ohmura
(Continued)

FOREIGN PATENT DOCUMENTS

CN 1979690 A 6/2007
CN 102339649 A 2/2012
(Continued)

OTHER PUBLICATIONS

Supplementary European Search Report cited in EP20923694.2, mailed on May 13, 2022, 8 pages.
(Continued)

*Primary Examiner* — Amine Riad
(74) *Attorney, Agent, or Firm* — Kilpatrick Townsend & Stockton LLP

(57) ABSTRACT

Embodiments of the present disclosure provide a memory test method and a device thereof, an electronic device, and a computer-readable storage medium, which relate to the field of semiconductor device testing technologies. The method is executed by a built-in self-test circuit and includes: acquiring defect information of a first memory by testing the first memory; acquiring repair information of the first memory based on the defect information of the first memory; and storing the repair information of the first memory in a second memory.

11 Claims, 12 Drawing Sheets

(51) Int. Cl.
*G06F 11/22* (2006.01)
*G06F 11/27* (2006.01)

(58) Field of Classification Search
CPC . G11C 29/1206; G11C 29/44; G11C 29/4401; G11C 29/4402
See application file for complete search history.

(56) References Cited

U.S. PATENT DOCUMENTS

| | | |
|---|---|---|
| 2004/0260987 A1 | 12/2004 | Ohlhoff |
| 2005/0149803 A1 | 7/2005 | Hirano |
| 2009/0137070 A1 | 5/2009 | Co |
| 2012/0173921 A1 | 7/2012 | Wuu |
| 2013/0246867 A1* | 9/2013 | Yang ............ G11C 29/56 714/E11.177 |
| 2014/0281693 A1 | 9/2014 | Jeddeloh et al. |
| 2014/0317460 A1* | 10/2014 | Kleveland ............ G11C 29/44 714/710 |
| 2015/0380109 A1 | 12/2015 | Jeddeloh |
| 2016/0093401 A1 | 3/2016 | Chang et al. |
| 2018/0190367 A1 | 7/2018 | Jeddeloh et al. |
| 2019/0258538 A1 | 8/2019 | Byun et al. |
| 2020/0349000 A1 | 11/2020 | Byun et al. |
| 2022/0343994 A1 | 10/2022 | Chang et al. |

FOREIGN PATENT DOCUMENTS

| | | |
|---|---|---|
| CN | 103403809 A | 11/2013 |
| CN | 103745752 A | 4/2014 |
| CN | 108511029 A | 9/2018 |
| CN | 110120242 A | 8/2019 |
| CN | 113393893 A | 9/2021 |

OTHER PUBLICATIONS

Written Opinion cited in PCT/CN2020/121297, mailed on Jan. 14, 2021, 6 pages.
First Office Action cited in CN202010166643.9, issued on Feb. 22, 2022, 19 pages.
Second Office Action cited in CN02010166643.9, issued on Aug. 12, 2022, 19 pages.
International Search Report as cited in PCT Application No. PCT/CN2020/121297 mailed Jan. 14, 2021, 13 pages.

* cited by examiner

METHOD FOR TESTING MEMORY BY BUILT-IN SELF-TEST STORAGE SPACE AND RELATED DEVICE

CROSS REFERENCE OF RELATED APPLICATIONS

This application claims priority to Chinese Patent Application No. 202010166643.9, filed on Mar. 11, 2020 and entitled "METHOD FOR TESTING MEMORY AND RELATED DEVICE", the disclosure of which is herein incorporated by reference in its entirety.

TECHNICAL FIELD

The present disclosure relates to the field of semiconductor device test technologies, and in particular, to a memory test method and a related device.

BACKGROUND

As semiconductor process size becomes smaller and smaller and the scale of Integrated Circuit (IC) design becomes larger and larger, highly complex IC products are facing increasingly serious challenges such as high reliability, high quality, low cost, and shorter product launch cycle. On one hand, as the semiconductor process size becomes smaller and smaller, memories may have more and more types of defects. On the other hand, as the complexity of the IC products increases, the proportion of Random-Access Memories (RAMs) and other memories becomes larger and larger in the IC products.

On one hand, taking Dynamic Random-Access Memory (DRAM) testing as an example, defect positions and backup circuit information of a memory need to be stored in an internal memory space of Automatic Test Equipment (ATE) for testing a memory, and repair information is acquired by analyzing operation behaviors through the ATE to repair the memory.

When testing a mass memory or requiring precise analysis, the internal memory space of the ATE may be insufficient and the test may be forced to suspend and a plurality of tests and repairs are required, increasing test costs. In the related art, since the internal memory space of the ATE is limited and defect position storage and defect analysis are not even supported, if the memory space of the ATE needs to be increased, the ATE will be very expensive, or the expansion of the memory space has reached the upper limit of the ATE.

One solution in the related art is to test with high-rate compression. However, it may lead to problems such as the memory cannot be repaired and the yield is low.

On the other hand, when the ATE tests the DRAM with Direct Access Pads (DA Pads), as the bit width of the DRAM increases, it is impossible to complete the test of an entire wafer in one touch-down (referring to the contact with the DA Pad in one press when testing with a probe card) operation. In addition, when performing high-speed test, high-end machines are required, which may significantly increase test costs.

It should be noted that information disclosed in the background section above is merely used to enhance understanding on the background of the present disclosure, and therefore may include information that does not constitute the prior art known to those of ordinary skill in the art.

SUMMARY

An objective of the present disclosure is to overcome the above shortcomings in the prior art, and provide a memory test method and a related device, which can overcome the above technical problems in the prior art, i.e., the memory space of the ATE is limited and insufficient for storing defect information and repair information of a memory during test, and the test cost is high, the test cycle is long and the test speed is limited.

An embodiment of the present disclosure provides a memory test method. The method is executed by a built-in self-test circuit and includes: acquiring defect information of a first memory by testing the first memory; acquiring repair information of the first memory based on the defect information of the first memory; and storing the repair information of the first memory in a second memory.

An embodiment of the present disclosure provides a memory test device. The device is provided in a built-in self-test circuit and includes: a defect information acquiring unit, configured to acquire defect information of a first memory by testing the first memory; a repair information acquiring unit, configured to acquire repair information of the first memory based on the defect information of the first memory; and a repair information storage unit, configured to store the repair information of the first memory in the second memory.

An embodiment of the present disclosure provides an electronic device. The electronic device includes: one or more processors; and a storage device for storing one or more programs. The one or more programs, when executed by the one or more processors, cause the one or more processors to implement the memory test method in above embodiments.

An embodiment of the present disclosure provides a computer-readable storage medium having a computer program stored thereon. The computer program, when executed by a processor, causes the processor to implement the memory test method in above embodiments.

It should be understood that the above general description and the following detailed description are merely exemplary and explanatory, and are not intended to limit the present disclosure.

BRIEF DESCRIPTION OF THE DRAWINGS

The accompanying drawings herein are incorporated into the description and constitute a part thereof, illustrating embodiments conforming to the present disclosure and explaining the principle of the present disclosure together with the description. Obviously, the accompanying drawings described hereinafter are merely some embodiments of the present disclosure, and a person of ordinary skill in the art may obtain other drawings based on these drawings without creative efforts.

DETAILED DESCRIPTION

Figure 1:
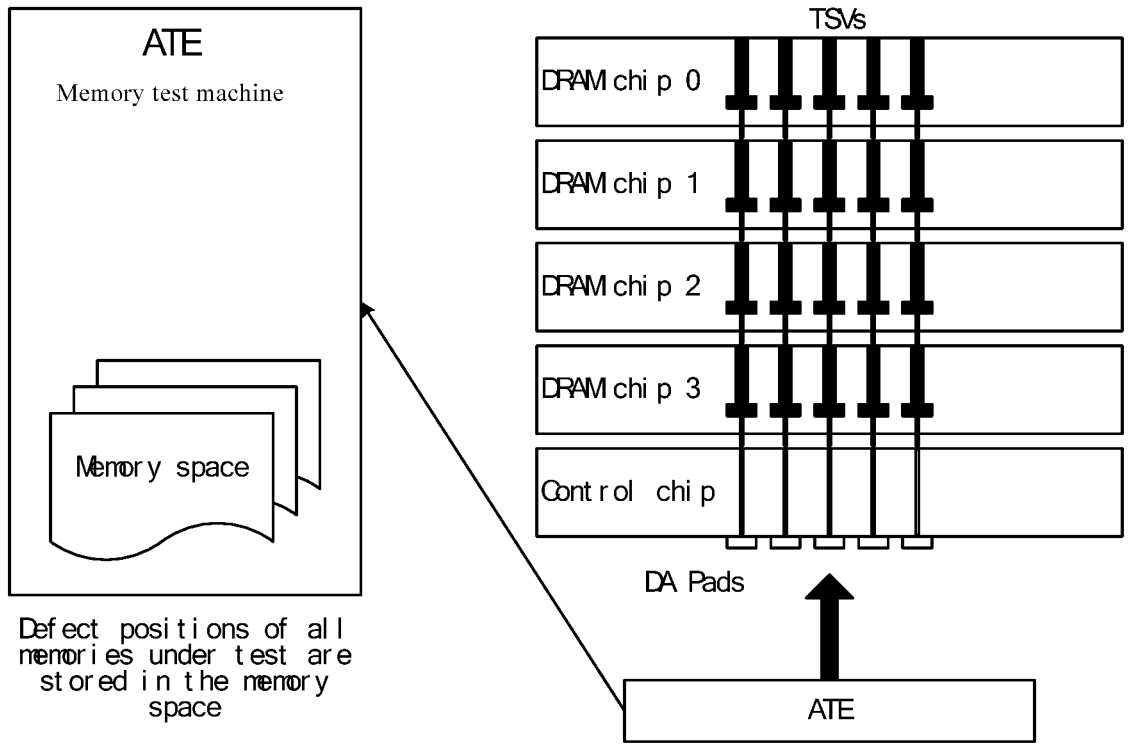
FIG. 1 is a schematic diagram of testing a DRAM in the related art.

Exemplary embodiments will now be described more fully with reference to the accompanying drawings. However, the exemplary embodiments can be implemented in various ways and shall not be construed as limited to the embodiments set forth herein; rather, these embodiments are provided to make the present disclosure full and complete, and fully convey the concept of the exemplary embodiments to those skilled in the art. Like reference numerals through the drawings denote the same or similar structures, and thus their detailed description will be omitted. In addition, the figures are only used for schematic illustration but are not necessarily drawn to scale.

Although relative terms such as "upper" and "lower" are used in the specification to describe the relative relationship of one component with respect to another component as shown in the figures, these terms are used in this specification only for convenience, for example, based on the exemplary directions shown in the figures. It is to be understood that if an apparatus shown in the figures is turned upside down, the described "upper" component will become a "lower" component. When a structure is "on" another structure, it may mean that the structure is integrally formed on the another structure, or that the structure is "directly" provided on the another structure, or that the structure is "indirectly" provided on the another structure via still another structure.

The terms "a", "an", "the", "said", and "at least one" are used to indicate the presence of one or more elements/components etc. The terms "include" and "have" are used to indicate the meaning including an opening inclusion and indicate that there may be other elements/components etc. in addition to the listed elements/components etc. The terms "first" and "second" are only used as reference only, not as a restriction on the number of their subjects.

FIG. 1 is a schematic diagram of testing a DRAM in the related art. As shown in FIG. 1, a storage device including four DRAM chips (DRAM chips 0-3) stacked on a control chip is taken as an example. The four DRAM chips are electrically connected by Through-Silicon Vias (TSVs).

In the related art, testing the DRAM chips 0-3 of the storage device with ATE includes the following steps.

1. The ATE tests the DRAM chip 0, and detects defect positions and backup circuit information of the DRAM chip 0.
2. The ATE stores the defect position of the DRAM chip 0 in its internal memory pace, and analyzes the same to acquire repair information of the DRAM chip 0.
3. The DRAM chip 0 is repaired based on the repair information thereof stored in the internal memory space of the ATE.
4. The ATE tests the DRAM chip 0 again, until it is confirmed that the DRAM chip 0 is repaired successfully.
5. The ATE tests the DRAM chip 1, and detects defect positions and backup circuit information of the DRAM chip 1.
6. The ATE stores the defect position of the DRAM chip 1 in its internal memory space, and analyzes the same to acquire repair information of the DRAM chip 1.
7. The DRAM chip 1 is repaired based on the repair information thereof stored in the internal memory space of the ATE.
8. The ATE tests the DRAM chip 1 again, until it is confirmed that the DRAM chip 1 is repaired successfully.
9. The ATE tests the DRAM chip 2, detects defect positions and backup circuit information of the DRAM chip 2.
10. The ATE stores the defect position of the DRAM chip 2 in its internal memory space, and analyzes the same to acquire repair information of the DRAM chip 2.
11. The DRAM chip 2 is repaired based on the repair information thereof stored in the internal memory space of the ATE.
12. The ATE tests the DRAM chip 2 again, until it is confirmed that the DRAM chip 2 is repaired successfully.
13. The ATE tests the DRAM chip 3, detects defect positions and backup circuit information of the DRAM chip 3.
14. The ATE stores the defect position of the DRAM chip 3 in its internal memory space of the ATE, and analyzes the same to acquire repair information of the DRAM chip 3.
15. The DRAM chip 3 is repaired based on the repair information thereof stored in the internal memory space of the ATE.
16. The ATE tests the DRAM chip 3 again, until it is confirmed that the DRAM chip 3 is repaired successfully.

It can be seen that in the related art, on one hand, defect position and repair information of all memories under test are stored in the internal memory space of the ATE. When testing a mass memory or requiring precise analysis, the internal memory space of the ATE may be insufficient and the test may be forced to suspend and a plurality of tests and repairs are required, increasing test costs. On the other hand, the ATE directly provides a test clock signal to the DRAM chip and a high-speed machine is required for high-speed test, increasing test costs. At the same time, it is necessary to provide a large number of DA Pads on the control chip, which may lead to a high cost for producing a probe card, and it is difficult to complete the test of an entire wafer in one touch-down operation.

Figure 2:
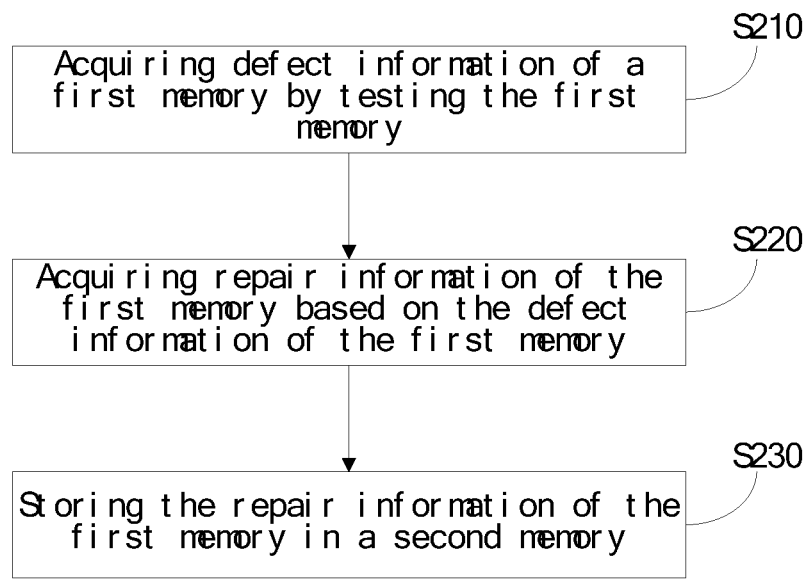
FIG. 2 is a schematic flowchart of a memory test method according to an embodiment of the present disclosure.

FIG. 2 is a schematic flowchart of a memory test method according to an embodiment of the present disclosure. As shown in FIG. 2, the method according to the embodiment of the present disclosure may include the following steps.

In an exemplary embodiment, the method may be executed by a built-in self-test (BIST) circuit. The BIST circuit may be provided in a control chip in a storage device corresponding to a memory under test, or in a memory chip such as a DRAM chip in a storage device. The DRAM chip and the memory under test may belong to the same storage device, or may belong to different storage devices.

In step S210, defect information of a first memory is acquired by testing a first memory.

In the embodiment of the present disclosure, the first memory may be any type of memory, such as DRAM, Static Random-Access Memory (SRAM), Not AND (NAND, which is a flash storage device), NOR (which is also a flash storage device) and the like. The first memory may be a certain memory chip or some memory chips or all memory chips in a certain storage device, or may be a plurality of memory chips located on a plurality of different storage devices. Storage types of these different storage devices may be the same or different. For example, they may all be DRAMs, all be SRAMs, or partly be DRAMs and partly be SRAMs, or partly be non-volatile memories such as NANDs or NORs and the like, which is not limited in the present disclosure.

In an exemplary embodiment, the storage device where the first memory is located may further include a control chip, and the built-in self-test circuit may be provided in the control chip. However, the present disclosure is not limited to this. In other embodiments, the built-in self-test circuit may also be provided in any memory chip in the storage device where the first memory is located.

In an exemplary embodiment, the first memory may be vertically stacked above or below the control chip. However, the present disclosure is not limited to this. The first memory may also be horizontally interconnected with the control chip.

In an exemplary embodiment, the first memory may include a plurality of memory chips which belong to the same storage device as the control chip. In some embodiments, the plurality of memory chips of the first memory may be stacked vertically in sequence above the control chip. In some other embodiments, the plurality of memory chips of the first memory may be stacked vertically in sequence below the control chip. In other embodiments, the plurality of memory chips of the first memory may be stacked vertically in sequence and horizontally interconnected with the control chip. In still other embodiments, the plurality of memory chips of the first memory and the control chip may be horizontally distributed on the storage device, which is not limited in the present disclosure.

When the BIST circuit executes the memory test method, a variety of test vectors for testing the first memory may be synthesized by a test vector generation algorithm in a computer. Then the ATE reads the test vectors from the computer and transmits the same to the BIST circuit. The BIST circuit transmits the test vectors to the first memory for testing. Alternatively, the test vector generation algorithm may be built into the ATE or BIST circuit, so that test vectors may be generated by the ATE or BIST circuit itself. When external pins of a plurality of memory chips in a storage device corresponding to the control chip are shared, it is necessary to determine to which of the plurality of memory chips the test vectors are to be transmitted. In this case, the ATE may first transmit the acquired test vectors to the control chip which determines which memory chips are the first memories and then transmits the received test vectors to the first memory for testing. In this way, the ATE may test a plurality of memory chips concurrently by using a small number of external pins of the storage device without being limited by the number of peripheral pins of the storage device.

In the embodiment of the present disclosure, the first memory may be tested by the BIST circuit. For example, the BIST circuit inputs a known string consisting of "0" and/or "1" into storage units corresponding to respective addresses of the first memory, reads these strings from the storage units corresponding to the respective addresses after a certain delay, and performs an XOR operation on the input strings and the read strings sequentially so as to determine which storage unit has an error. The address of the storage unit having an error may be recorded. That is, the defect information of the first memory may include the address corresponding to the storage unit having an error in the first memory, which may be called a defect position.

It should be noted that the method for testing the first memory is not limited to the above-exemplified method, and any other method may be used to test the first memory. In addition, the present disclosure does not limit testing the first memory by the BIST circuit. For example, the first memory may be tested by the ATE and the BIST circuit collectively, or the first memory may be tested by other electronic devices with test functions.

In step S220, repair information of the first memory is acquired based on the defect information of the first memory.

In the embodiment of the present disclosure, the BIST circuit may also analyze the cause of the error and learn the repair information on how to repair the first memory based on the acquired defect information. The repair information of the first memory may include the address, i.e., the defect position (which is part of the defect information) corresponding to the storage unit having an error in the first memory and repair information on how to repair the defect position. In other embodiments, the repair information of the first memory may further include backup circuit information in the first memory. The backup circuit information refers to that some redundant backup storage units need to be designed in order to ensure reliability in use in addition to storage units conventionally designed to store data, which is referred to as a redundant memory design. For example, in addition to 10,000 conventional storage units, the first memory is further provided with 200 backup storage units. When under test or in use, it is found that any one of the 10,000 conventional storage units has an error, the storage unit having an error may be replaced directly by a backup storage unit. The replacement herein means replacing the address of the storage unit, instead of physical replacement. Alternatively, during the repairmen of the storage unit having an error, the backup storage unit may be used instead until the storage unit is repaired in order to ensure the normal use of the memory.

In step S230, the repair information of the first memory is stored in the second memory.

In an exemplary embodiment, the first memory and the second memory may belong to the same storage device, or may belong to different storage devices. When they belong to different storage devices, types of the first memory and the second memory may be the same or different. For example, they may be both DRAM chips; alternatively, for example, one of them is a DRAM and the other is an SRAM.

Specifically, if a plurality of memory chips that may operate normally after test exist, states of the memory chips may be recorded. For example, current states of the memory chips may be recorded in a Config circuit of the BIST circuit. For example, if data (which may be any data) is already stored in a memory chip, its state is marked as "1", indicating that it is in an occupied state, and in this case, the repair information of the first memory may not be stored into this memory chip. In contrast, if no data is currently stored in a memory chip, its state is marked as "0", and in this case, this memory chip may be used as the second memory for storing part or all of the repair information of the first memory.

The memory test method according to the embodiment of the present disclosure expands the storage space for repair information of a memory under test by storing the same in a memory other than the ATE during test. On one hand, when a mass memory is under test, the internal memory space of the ATE need not be increased additionally, reducing the test cost. On the other hand, the memory under test need not be repaired in stages, improving the test speed, speeding up the test process, and shortening the test time. At the same time, by providing a built-in self-test circuit to test the memory, it is possible to test an entire wafer in one touch-down operation by a small number of DA Pads.

Figure 3:
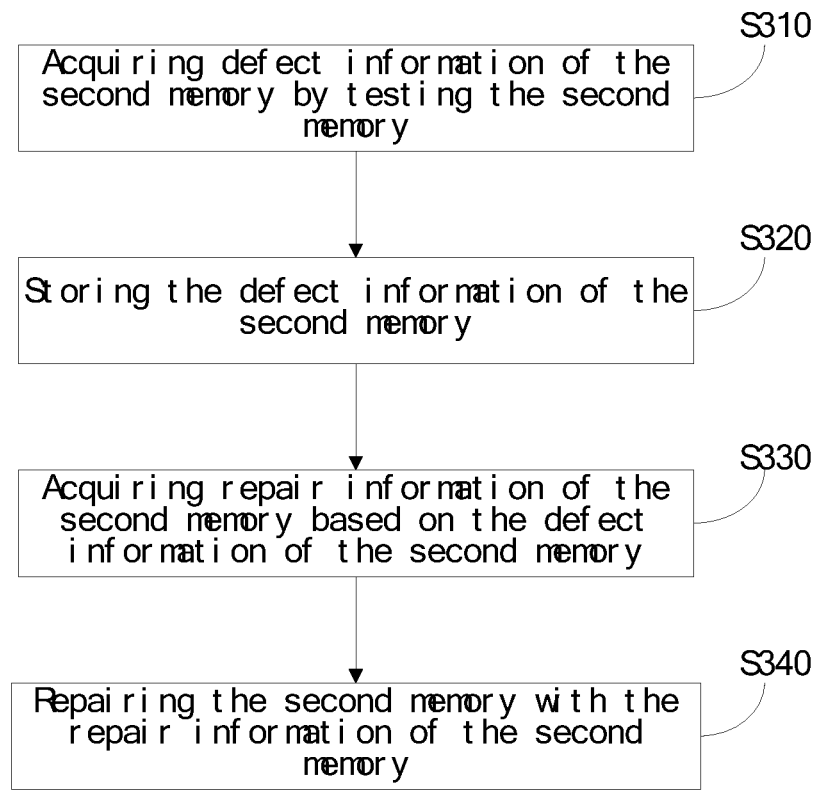
FIG. 3 is a schematic flowchart of a memory test method according to an embodiment of the present disclosure.

FIG. 3 is a schematic flowchart of a memory test method according to an embodiment of the present disclosure. As shown in FIG. 3, the difference from the above embodiment lies in that the method according to the present embodiment of the present disclosure may further include the following steps before testing the first memory.

In step S310, defect information of the second memory is acquired by testing the second memory.

In step S320, the defect information of the second memory is stored.

In step S330, the repair information of the second memory is acquired based on the defect information of the second memory.

In step S340, the second memory is repaired with the repair information of the second memory.

In the embodiment of the present disclosure, before storing the repair information of the first memory in the second memory, it is necessary to ensure that the second memory may operate normally. Therefore, the BIST circuit first tests the second memory. Specifically, when the BIST circuit testes the second memory, the defect information and repair information of the second memory may be stored in the BIST circuit, and a storage unit having an error in the second memory may be repaired based on the repair information of the second memory stored in the BIST circuit.

Hereinafter, the method in the above embodiment is exemplified with reference to FIG. 4. For example, taking a certain storage device as an example, it may include four DRAM chips 0-3 and a control chip. The control chip includes a BIST circuit. The DRAM chips 0-3 are stacked vertically in sequence on the control chip. It is assumed that the DRAM chip 0 serves as the second memory, and any one or some or all of the DRAM chips 1-3 serves as the first memory. The BIST circuit first tests the DRAM chip 0, stores defect information and repair information of the DRAM chip 0, repairs the DRAM chip 0, and then stores repair information of any one or some or all of the DRAM chips 1-3 in the DRAM chip 0. That is, the BIST circuit only needs to store a defect position of a single memory under test, instead of defect positions of all memories under test.

Stacked storage devices are formed by stacking several DRAM chips vertically together. Compared with traditional storage devices, the stacked storage devices have great advantages in connection, bandwidth, and delay, which not only saves space, but also realizes shorter chip pitch, and in turn shortens signal transmission path and delay. In the stacked storage devices, edges or specific positions of the DRAM chips may be perforated with Through Silicon Via (TSV) technology to form vias which serve as pathways for wiring and vertical interconnection.

Figure 4:
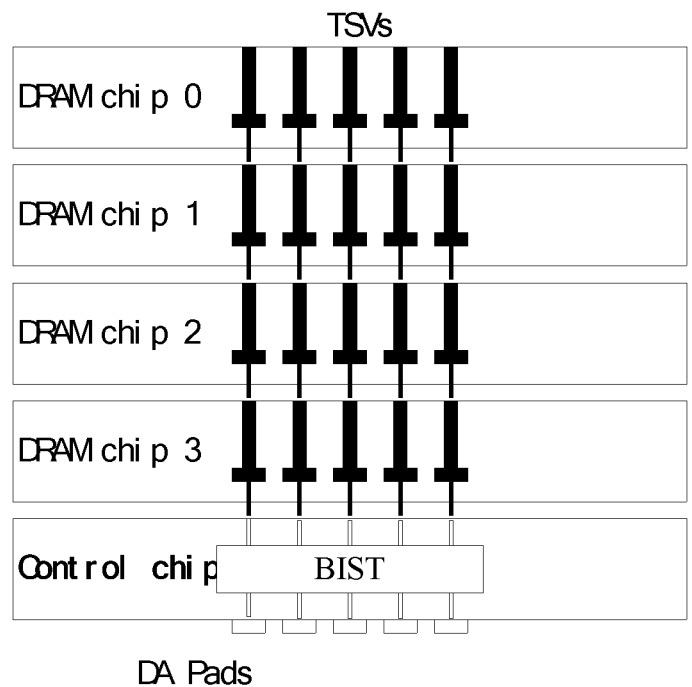
FIG. 4 is a schematic diagram of a memory test method according to an embodiment of the present disclosure.
Figure 5:
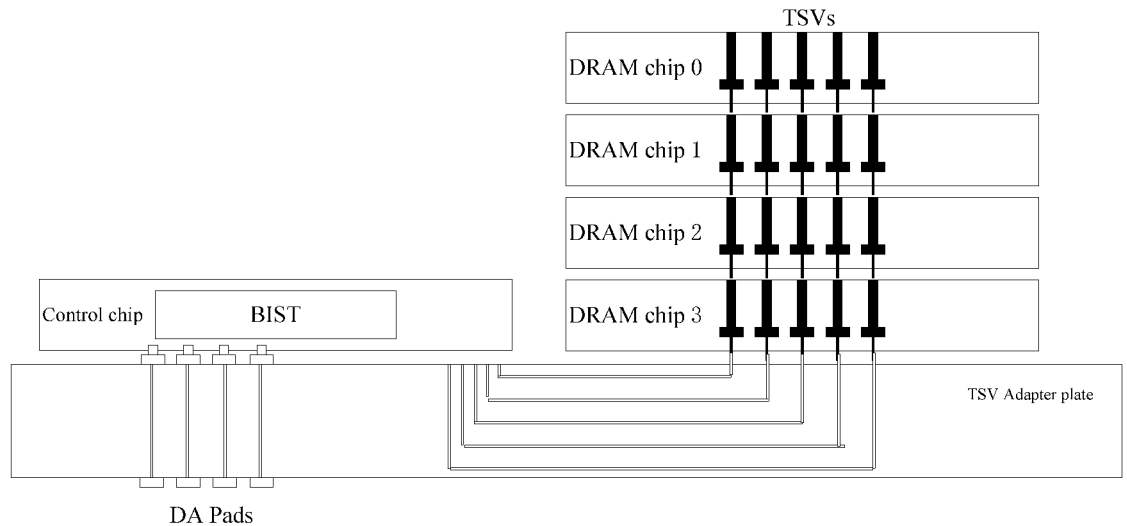
FIG. 5 is a schematic diagram of a memory test method according to an embodiment of the present disclosure.

The difference between the embodiment of FIG. 5 and the embodiment of FIG. 4 lies in that, in the embodiment of FIG. 5, the control chip and its BIST circuit may be horizontally interconnected with the vertically stacked DRAM chips 0-3 through a TSV adapter plate. Other content may be made reference to the above embodiment.

In storage devices in a stacked form, although vertical stacking allows a higher density of memory chips in the same space, it becomes difficult for the control chip to manage the memory chips. Therefore, in the embodiment of FIG. 6, a new level of control mechanism may be introduced into the original one-level control mechanism. Specifically, a Base/Logic Die (a control chip 2), on which a DRAM chip capable of managing a cluster of stacked storage devices is integrated, may be provided on the undermost layer of the TSV memory chip. The Base/Logic Die may directly communicate with the control chip 1 including GPU/CPU/Soc and the like, and may collect data in the stacked DRAM chips and help the control chip 1 including GPU/CPU/Soc and the like to manage the stacked DRAM chips. In a stacked system, the control chip 1 including GPU/CPU/Soc and the like may not even change significantly in scale and only needs to face the control chip 2 in the Base/Logic Die. The control chip 2 may manage the DRAM chips in respective layers of each cluster of stacks.

Figure 6:
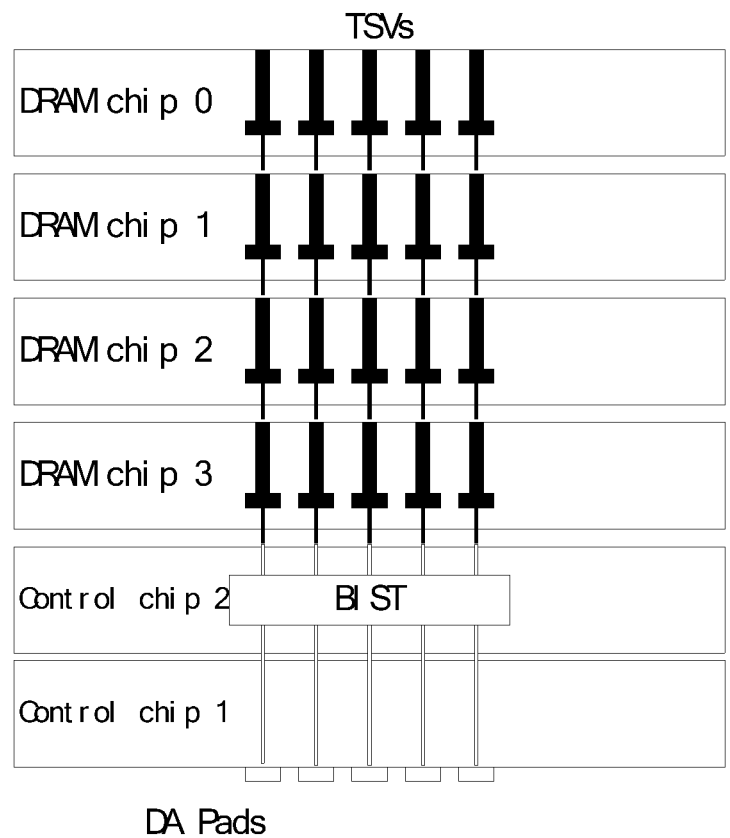
FIG. 6 is a schematic diagram of a memory test method according to an embodiment of the present disclosure.

In the embodiment of FIG. 6, the BIST circuit is provided in the control chip 2, and the control chip 1, the control chip 2, and the DRAM chips 0-3 are stacked vertically in sequence.

Figure 7:
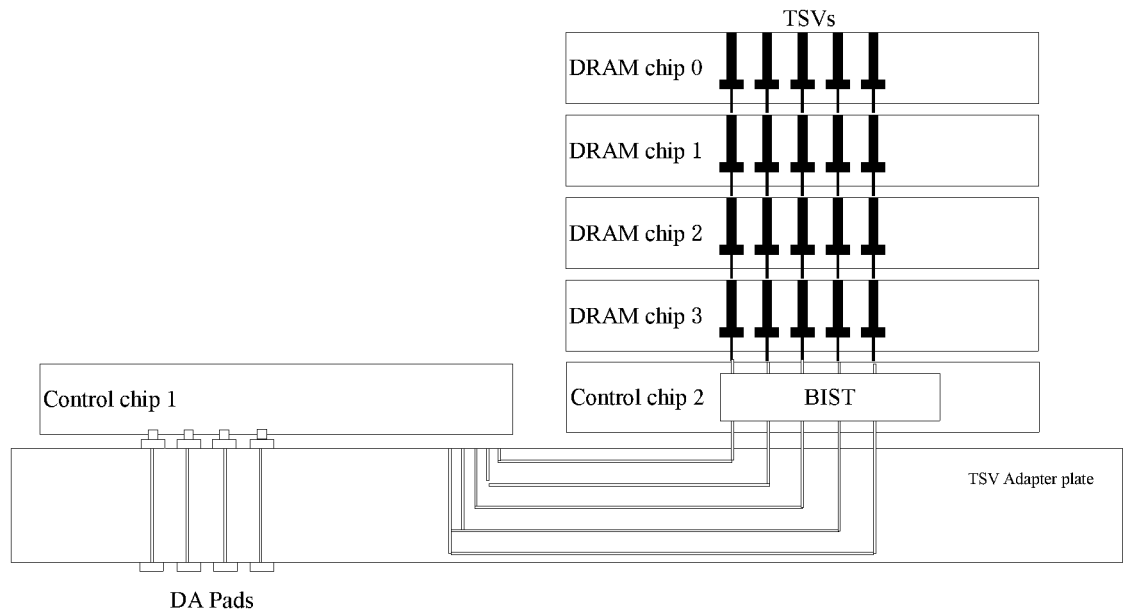
FIG. 7 is a schematic diagram of a memory test method according to an embodiment of the present disclosure.

The difference between the embodiment of FIG. 7 and the embodiment of FIG. 6 lies in that, in the embodiment of FIG. 7, the control chip 1 may be horizontally interconnected with the control chip 2 and its BIST circuit and the DRAM chips 0-3 vertically stacked together through a TSV adapter plate. Other content may be made reference to the above embodiments.

Figure 8:
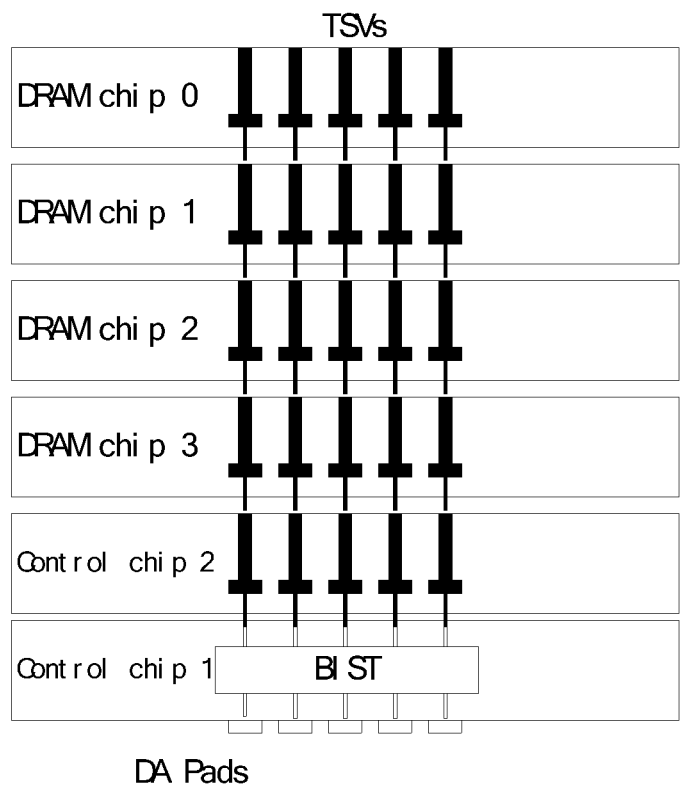
FIG. 8 is a schematic diagram of a memory test method according to an embodiment of the present disclosure.

In the embodiment of FIG. 8, the BIST circuit is provided in the control chip 1, and the control chip 1, the control chip 2, and the DRAM chips 0-3 are stacked vertically in sequence.

Figure 9:
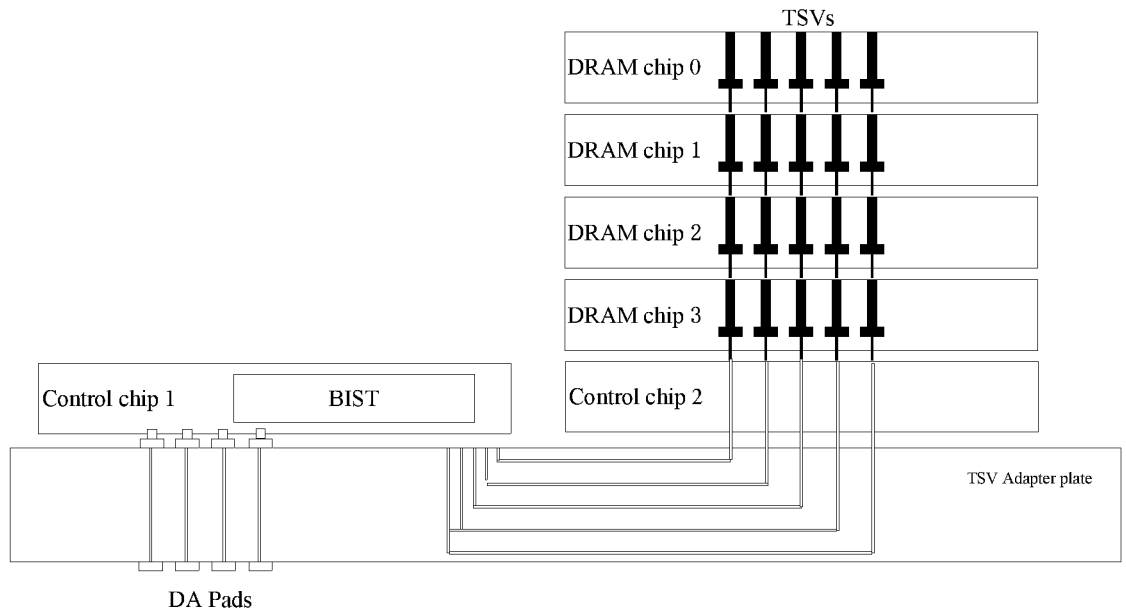
FIG. 9 is a schematic diagram of a memory test method according to an embodiment of the present disclosure.

The difference between the embodiment of FIG. 9 and the embodiment of FIG. 8 lies in that, in the embodiment of FIG. 9, the control chip 1 and its BIST circuit may be horizontally interconnected with the control chip 2 and the DRAM chips 0-3 vertically stacked together through a TSV adapter plate. Other content may be made reference to the above embodiments.

No matter where the BIST circuit is provided, any one or more of DRAM chips stacked thereon may be tested sequentially or concurrently.

Figure 10:
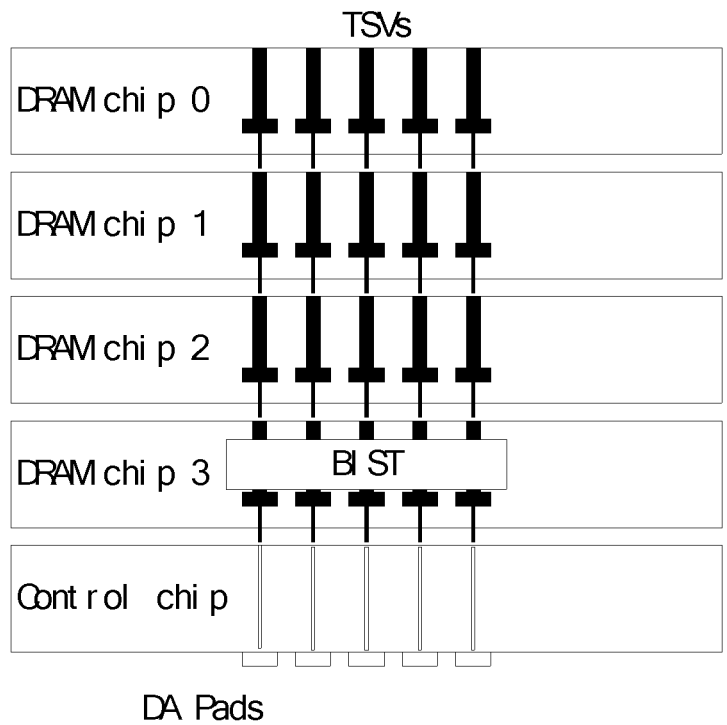
FIG. 10 is a schematic diagram of a memory test method according to an embodiment of the present disclosure.

The difference between the embodiment of FIG. 10 and the embodiment of FIG. 4 lies in that, in the embodiment of FIG. 10, the BIST circuit may be provided in any one of DRAM chips vertically stacked on the control chip. For example, the BIST circuit being provided in the DRAM chip 3 is taken as an example for description in the figure. The BIST circuit herein may also execute the memory test method in the above embodiments.

Figure 11:
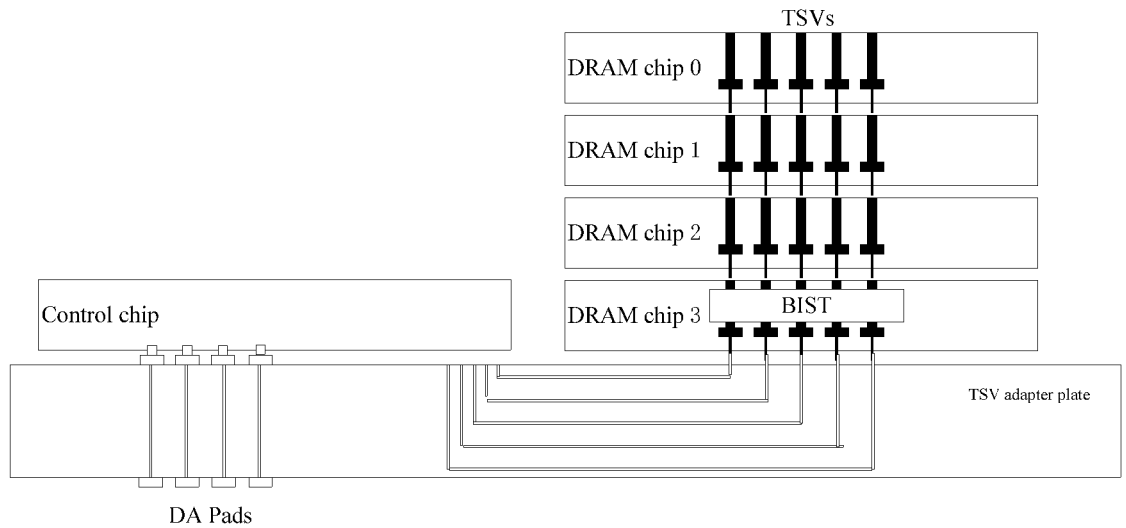
FIG. 11 is a schematic diagram of a memory test method according to an embodiment of the present disclosure.

The difference between the embodiment of FIG. 11 and the embodiment of FIG. 10 lies in that, in the embodiment of FIG. 11, the control chip may be horizontally interconnected with the vertically stacked DRAM chips 0-3 through a TSV adapter plate, and the BIST circuit is still provided in the DRAM chip 3. Other content may be made reference to the above embodiments.

Figure 12:
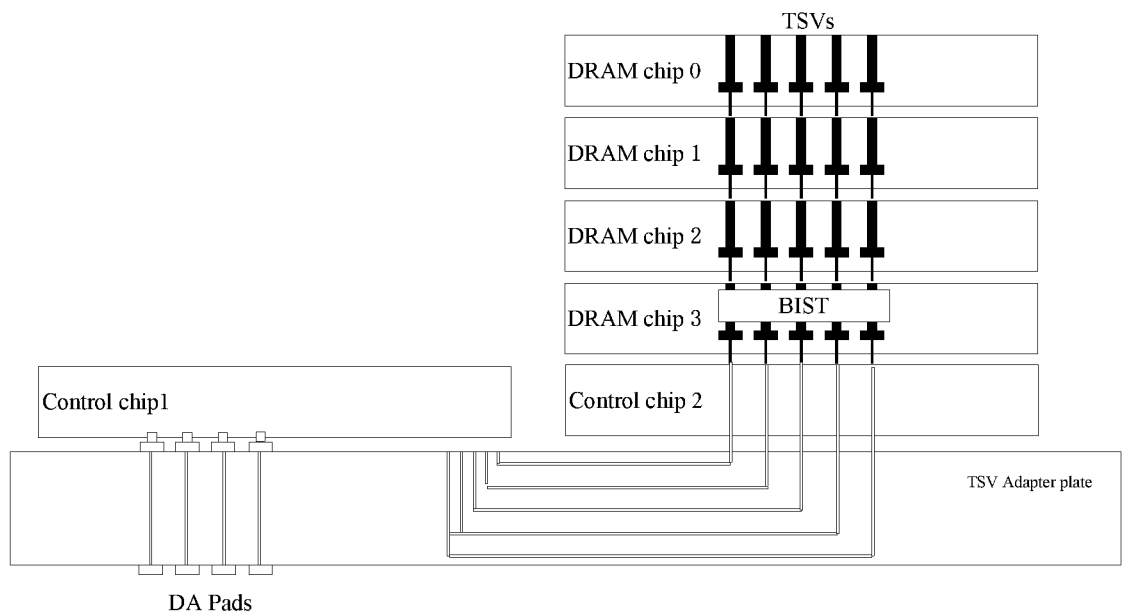
FIG. 12 is a schematic diagram of a memory test method according to an embodiment of the present disclosure.

The difference between the embodiment in FIG. 12 and the embodiment in FIG. 11 lies in that, in the embodiment of FIG. 12, the control chip 1 and the control chip 2 are included. The control chip 1 may be horizontally interconnected with the control chip 2 and the DRAM chips 0-3 vertically stacked together through a TSV adapter plate, and the BIST circuit is still provided in the DRAM chip 3. Other content may be made reference to the above embodiments.

In the above embodiment, the BIST circuit only needs to store defect information and repair information of a single memory under test, instead of defect information and repair information of all memories under test.

Figure 13:
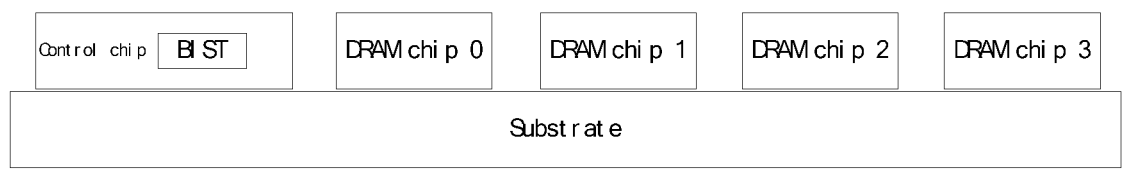
FIG. 13 is a schematic diagram of a memory test method according to an embodiment of the present disclosure.

The difference between the embodiment of FIG. 13 and the embodiment of FIG. 4 lies in that, in the embodiment of FIG. 13, the DRAM chips 0-3 and the control chip are horizontally distributed on a substrate of the same storage device. Similarly, the BIST circuit only needs to store defect information and repair information of a single memory under test, instead of defect information and repair information of all memories under test.

Figure 14:
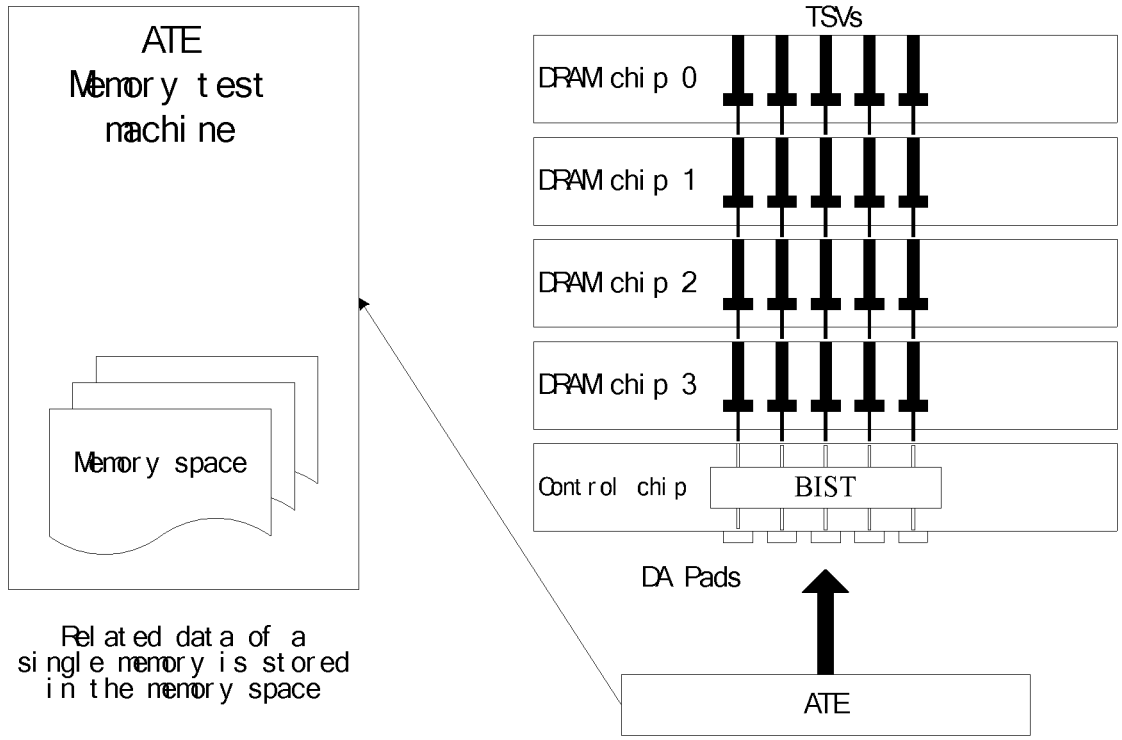
FIG. 14 is a schematic diagram of a memory test method according to an embodiment of the present disclosure.

In the embodiment of FIG. 14, in addition to storing the repair information of the first memory (which may be any one or more of the DRAM chips 1-3) during test in the second memory (still taking the DRAM chip 0 as an example herein) in the same storage device, defect positions and repair information of any memory during test may also be stored in the internal memory space of the ATE. In this case, the internal memory space of the ATE may only store defect positions and repair information of a single memory under test (i.e., related data of the single memory under test), while defect positions and repair information of other memories under test may be stored in any one or more of the DRAM chips.

Figure 15:
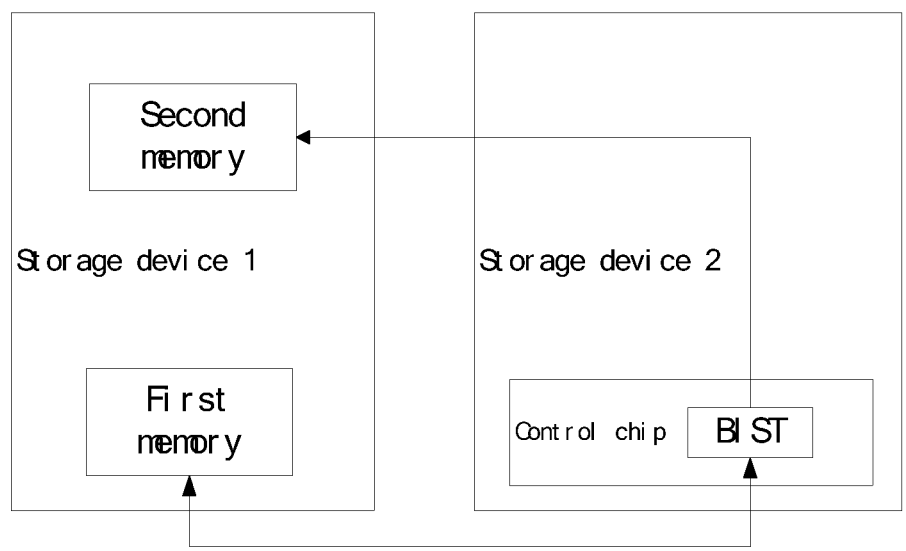
FIG. 15 is a schematic diagram of a memory test method according to an embodiment of the present disclosure.

In the above embodiment, the control chip, the first memory, and the second memory are all located in the same storage device. In the embodiment of FIG. 15, the first memory and the second memory are located in the same storage device. It is assumed that the first memory and the second memory are located in a storage device 1, and the control chip and its BIST circuit are located in another storage device which is assumed to be a storage device 2. The BIST circuit in the storage device 2 may first test the second memory in the storage device 1, then test the first memory in the storage device 1 after confirming that the second memory may operate normally, and transmit repair information of the first memory in the storage device 1 to the second memory in the storage device 1 for storage, thereby expanding the storage space of defect positions and repair information of the memory under test.

Figure 16:
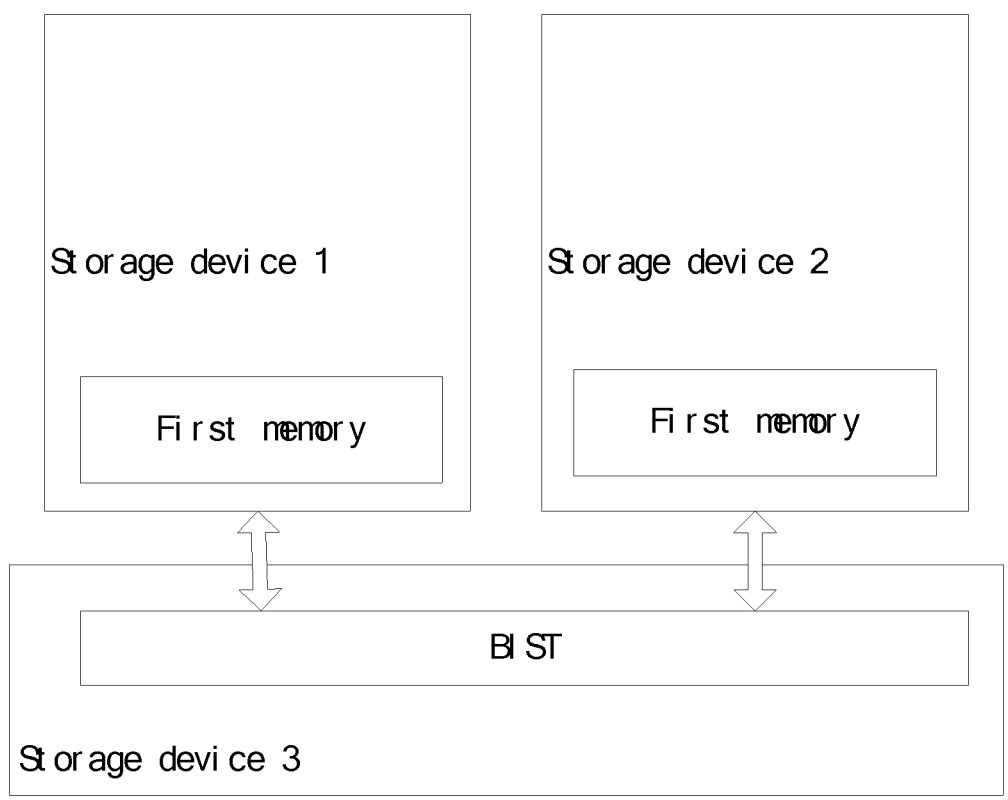
FIG. 16 is a schematic diagram of a memory test method according to an embodiment of the present disclosure.

In the embodiment of FIG. 16, the control chip and its BIST circuit, the first memory, and the second memory are respectively located in three different storage devices. It is assumed that the first memory is located in the storage device 1, the second memory is located in the storage device 2, and the control chip and its BIST circuit are located in a storage device 3. The BIST circuit in the storage device 3 may first test the second memory in the storage device 2, then test the first memory in the storage device 1 after confirming that the second memory may operate normally, and transmit repair information of the first memory in the storage device 1 to the second memory in the storage device 2 for storage, thereby expanding the storage space of defect positions and repair information of the memory under test.

Figure 17:
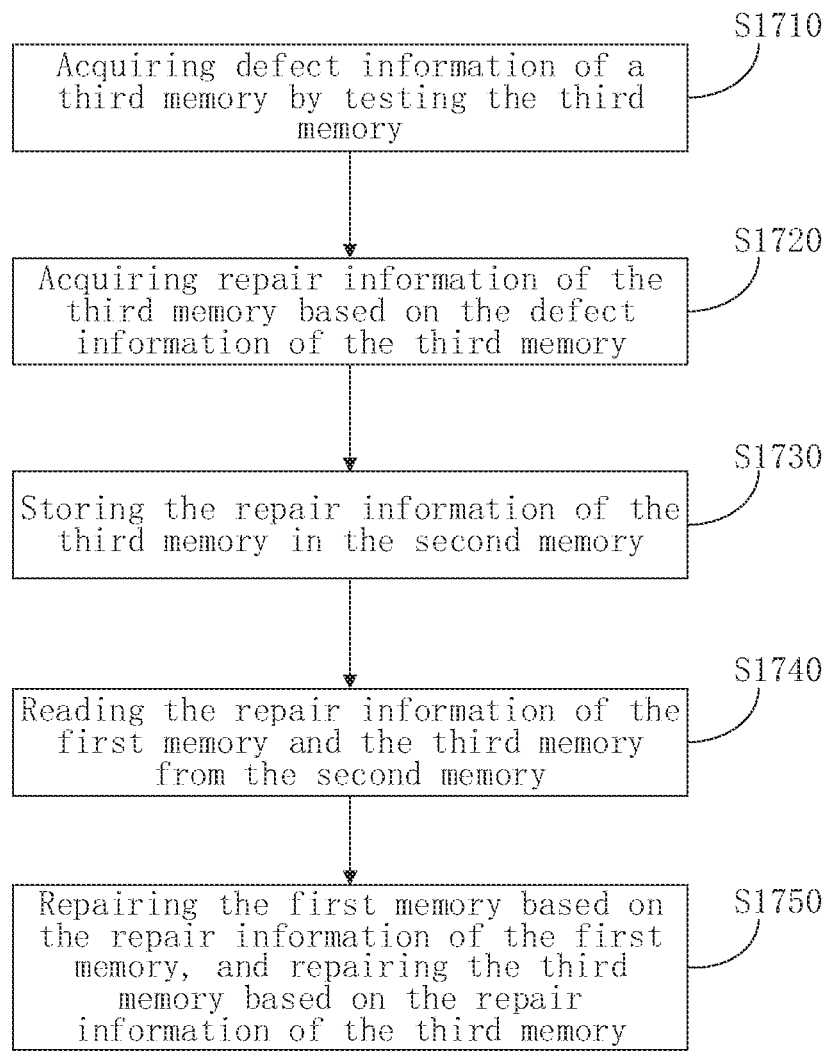
FIG. 17 is a schematic flowchart of a memory test method according to an embodiment of the present disclosure.

FIG. 17 is a schematic flowchart of a memory test method according to an embodiment of the present disclosure. As shown in FIG. 17, the difference from the above embodiments lies in that the method according to the present embodiment of the present disclosure may further include the following steps before testing the first memory.

In step S1710, defect information of a third memory is acquired by testing the third memory.

In step S1720, repair information of the third memory is acquired based on the defect information of the third memory.

In step S1730, the repair information of the third memory is stored in the second memory.

Similar to the above process of testing the first memory, when testing the third memory, the BIST circuit analyzes the defect information of the third memory to acquire the repair information. Instead of being stored in the BIST circuit, the repair information of the third memory is transmitted to the second memory for storage.

In step S1740, the repair information of the first memory and the third memory is read from the second memory.

In step S1750, the first memory is repaired based on the repair information of the first memory, and the third memory is repaired based on the repair information of the third memory.

In the embodiment of the present disclosure, after the first memory and the third memory are tested, the BIST circuit reads the repair information of the first memory and the third memory from the second memory, and repairs the first memory and the third memory respectively.

An example is described below with reference to the embodiment of FIG. 18. It is assumed that the DRAM chip 0 is the second memory, the DRAM chip 1 is the first memory, and the DRAM chip 2 is the third memory, and the DRAM chip 3 is the fourth memory. The BIST circuit first tests the DRAM chip 0, detects and stores defect information and backup circuit information of the DRAM chip 0, analyzes the same to acquire repair information of the DRAM chip 0, and repairs the DRAM chip 0 based on the repair information. After completing the repair, the BIST circuit needs to test the DRAM chip 0 again and so on until the DRAM chip 0 passes the test. If the DRAM chip 0 passes the first test, the DRAM chip 0 may not be repaired.

Then the BIST circuit tests the DRAM chip 1, detects defect information and backup circuit information of the DRAM chip 1 during test, acquires repair information of the DRAM chip 1 by analyzing the defect information and stores the same into the DRAM chip 0.

Then the BIST circuit tests the DRAM chip 2, detects defect information and backup circuit information of the DRAM chip 2 during test, acquires repair information of the DRAM chip 2 by analyzing the defect information and stores the same into the DRAM chip 0.

Then the BIST circuit tests the DRAM chip 3, detects defect information and backup circuit information of the DRAM chip 3 during test, acquires repair information of the DRAM chip 3 by analyzing the defect information and stores the same into the DRAM chip 0.

Then the BIST circuit reads the repair information of the DRAM chips 1-3 from the DRAM chip 0 to repair the DRAM chips 1-3, and then tests the DRAM chips 1-3 again until it is confirmed that the DRAM chips 1-3 are repaired successfully.

In the above test process, the BIST circuit tests the DRAM chips 1-3 sequentially, that is, one by one. However, in other embodiments, the BIST circuit may also test the DRAM chips 1-3 concurrently, that is, simultaneously.

It should be noted that merely the DRAM chip 0 being used as the second memory is taken as an example for description. In fact, repair information of a memory under test may be stored in a memory chip at any layer that operates normally after test or any partly repaired memory.

Figure 18:
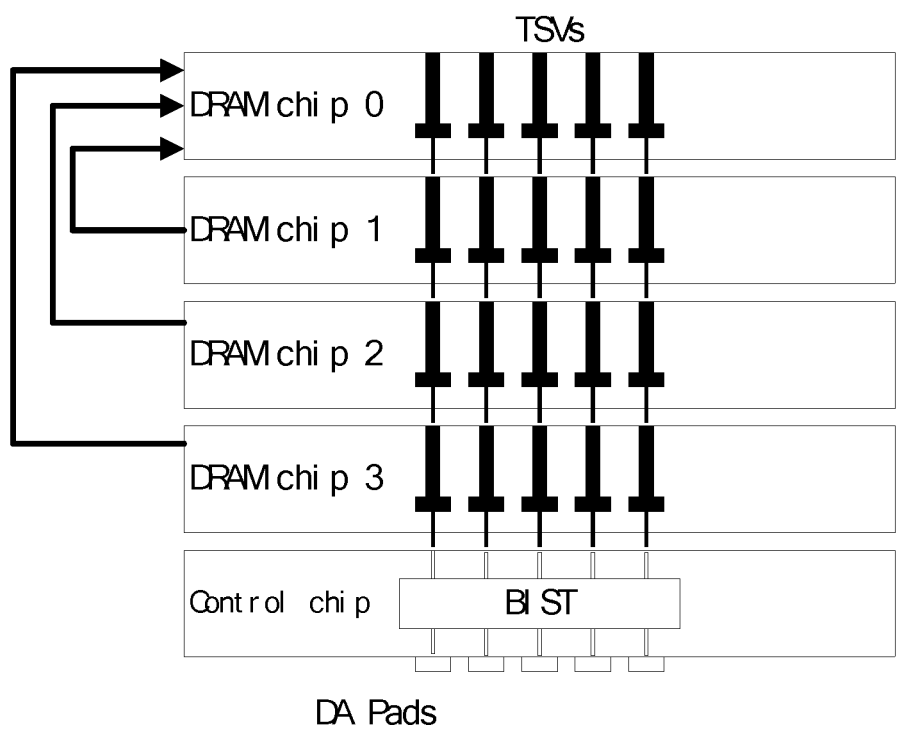
FIG. 18 is a schematic diagram of a method of testing a memory according to an embodiment of the present disclosure.

It should be understood that although the DRAM chips in the embodiment of FIG. 18 are stacked vertically in sequence on the control chip, it can be known according to the above embodiments that the structural layout form between the memory chips and the control chip in a storage device is not limited in the present disclosure. The BIST circuit is not limited to be provided in the control chip, instead, the BIST circuit may also be provided in any one of the DRAM chips.

In the above example, the first memory, the second memory, the third memory, and the fourth memory being located in the same storage device is taken as an example for description. However, the present disclosure is not limited to this. It is assumed that the first memory is located in the storage device 1, the second memory is located in the storage device 2, the third memory is located in the storage device 3, and the fourth memory is located in the storage device 4. The BIST circuit may first test the second memory in the storage device 2, then test the first memory in the storage device 1, and may transmit repair information of the first memory in the storage device 1 to the second memory in the storage device 2 for storage. Then the BIST circuit may first test the third memory in the storage device 3, then may transmit repair information of the third memory in the storage device 3 to the second memory in the storage device 2 for storage. Then the BIST circuit may test the fourth memory in the storage device 4, then may transmit repair information of the fourth memory in the storage device 4 to the second memory in the storage device 2 for storage. Then, the BIST circuit may read the repair information of the first memory, the third memory and the fourth memory from the second memory in the storage device 2, and repair the first memory, the third memory and the fourth memory respectively. Alternatively, the BIST circuit may also repair the storage device 1 first, then test the third memory in the storage device 3, and then transmit the repair information of the third memory in the storage device 3 to the first memory of the storage device 1 for storage. Then the BIST circuit may test the fourth memory in the storage device 4, and then transmit the repair information of the fourth memory in the storage device 4 to the first memory of the storage device 1 for storage.

Figure 19:
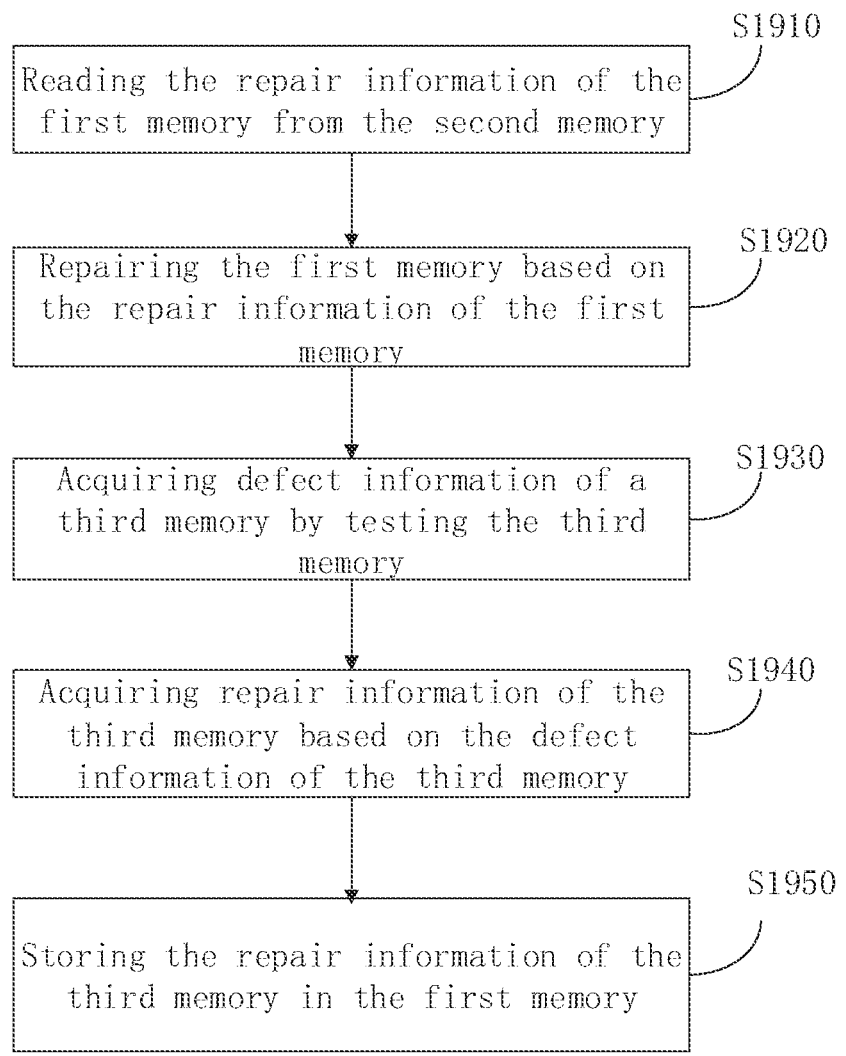
FIG. 19 is a schematic flowchart of a memory test method according to an embodiment of the present disclosure.

FIG. 19 is a schematic flowchart of a memory test method according to an embodiment of the present disclosure. As shown in FIG. 19, the difference from the above embodiments lies in that the method according to the present embodiment of the present disclosure may further include the following steps.

In step S1910, the repair information of the first memory is read from the second memory.

In step S1920, the first memory is repaired based on the repair information of the first memory.

In the embodiment of the present disclosure, the BIST circuit may first read the repair information of the first memory from the second memory, and then repair the first memory to be served as the storage space for repair information of other memories under test.

In step S1930, defect information of a third memory is acquired by testing the third memory.

In step S1940, repair information of the third memory is acquired based on the defect information of the third memory.

In step S1950, the repair information of the third memory is stored in the first memory.

In the embodiment of the present disclosure, the BIST circuit may test the third memory, and then store the repair information of the third memory in the first memory that has been repaired.

Figure 20:
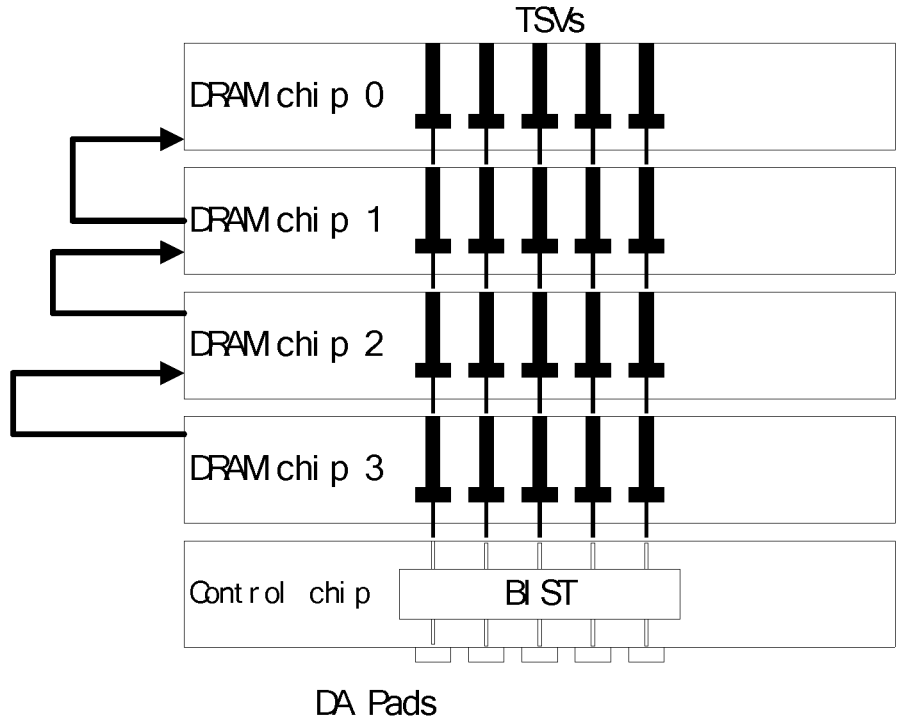
FIG. 20 is a schematic diagram of a memory test method according to an embodiment of the present disclosure.

An example is described below with reference to the embodiment of FIG. 20. It is assumed that the DRAM chip 0 is the second memory, the DRAM chip 1 is the first memory, and the DRAM chip 2 is the third memory. The BIST circuit first tests the DRAM chip 0, detects and stores defect information and backup circuit information of the DRAM chip 0, analyzes the same to acquire repair information of the DRAM chip 0, and repairs the DRAM chip 0 based on the repair information. After completing the repair, the BIST circuit needs to test the DRAM chip 0 again and so on until the DRAM chip 0 passes the test. If the DRAM chip 0 passes the first test, the DRAM chip 0 may not be repaired.

Then the BIST circuit tests the DRAM chip 1, detects defect information and backup circuit information of the DRAM chip 1 during test, acquires repair information of the DRAM chip 1 by analyzing the defect information and stores the same into the DRAM chip 0.

Then the BIST circuit reads the repair information of the DRAM chip 1 from the DRAM chip 0, and repairs the DRAM chip 1. After completing the repair, the BIST circuit tests the DRAM chip 1 again and so on until the DRAM chip 1 passes the test. If the DRAM chip 1 passes the first test, the DRAM chip 1 may not be repaired. The BIST circuit then tests the DRAM chip 2, detects defect information and backup circuit information of the DRAM chip 2 during test, acquires repair information of the DRAM chip 2 by analyzing the defect information and stores the same into the DRAM chip 1.

Then the BIST circuit reads the repair information of the DRAM chip 2 from the DRAM chip 1, and repairs the DRAM chip 2. After completing the repair, the BIST circuit tests the DRAM chip 2 again and so on until the DRAM chip 2 passes the test. If the DRAM chip 2 passes the first test, the DRAM chip 2 may not be repaired. The BIST circuit then tests the DRAM chip 3, detects defect information and backup circuit information of the DRAM chip 3 during test, acquires repair information of the DRAM chip 3 by analyzing the defect information and stores the same into the DRAM chip 2.

Then the BIST circuit reads the repair information of the DRAM chip 3 from the DRAM chip 2, and repairs the DRAM chip 3. After completing the repair, the BIST circuit tests the DRAM chip 3 again and so on until the DRAM chip 3 passes the test. If the DRAM chip 3 passes the first test, the DRAM chip 3 may not be repaired.

In the above example, the first memory, the second memory, and the third memory being located in the same storage device is taken as an example for description. However, the present disclosure is not limited to this. It is assumed that the first memory is located in the storage device 1, the second memory is located in the storage device 2, and the third memory is located in the storage device 3. The BIST circuit may first test the second memory in the storage device 2, then test the first memory in the storage device 1, and may transmit repair information of the first memory in the storage device 1 to the second memory in the storage device 2 for storage. Then the BIST circuit may first test the third memory in the storage device 3, then may transmit repair information of the third memory in the storage device 3 to the second memory in the storage device 2 for storage. Then the BIST circuit may read the repair information of the first memory and the third memory from the second memory in the storage device 2, and repair the first memory and the third memory respectively. Alternatively, the BIST circuit may also repair the storage device 1 first, then test the third memory in the storage device 3, and transmit the repair information of the third memory in the storage device 3 to the first memory of the storage device 1 for storage.

In an exemplary embodiment, the method may further include: acquiring test data of the first memory; and storing the test data of the first memory in the second memory.

In the embodiments of the present disclosure, the second memory that may operate normally after test is not limited to only being used to record repair information of a memory under test. In other embodiments, the second memory may also be used to store any other data, such as the test data of the first memory. The test data may be, for example, test vectors used to test the first memory, or test result data of a test performed by the first memory with the test vectors, and the like.

In the memory test method according to the embodiments of the present disclosure, the memory is tested by a BIST circuit. On one hand, it is possible to test an entire wafer in one touch-down operation. On the other hand, the same TSV path is used for accessing a DRAM chip in the memory test method according to the embodiments of the present disclosure as normal operation, so that the timing is closer to that of the normal operation of the DRAM chip. At the same time, the BIST circuit may also test each DRAM chip in a stack simultaneously, saving the test time. When performing high-speed test, no high-speed ATE machine is required, reducing test costs.

Figure 21:
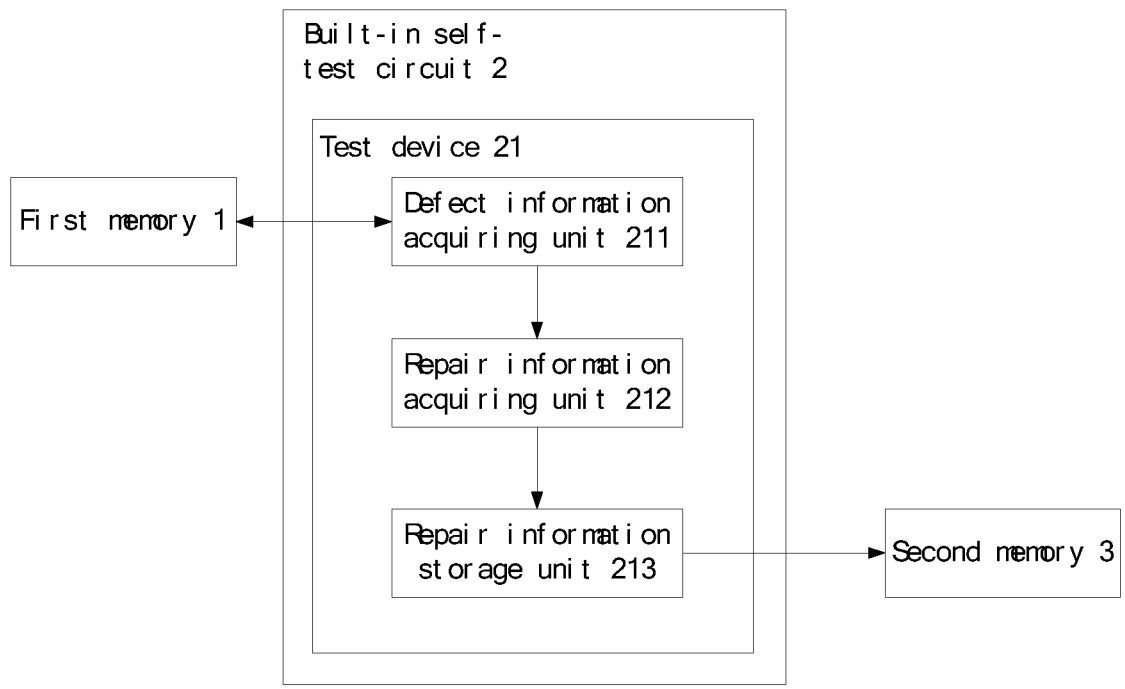
FIG. 21 is a schematic diagram of a memory test device according to an embodiment of the present disclosure.

FIG. 21 is a schematic diagram of a memory test device according to an embodiment of the present disclosure. As shown in FIG. 21, in the embodiment of the present disclosure, a test device 21 is provided in a built-in self-test circuit 2. The test device 21 may include a defect information acquiring unit 211, a repair information acquiring unit 212, and a repair information storage unit 213.

The defect information acquiring unit 211 may be configured to acquire defect information of a first memory 1 by testing the first memory 1. The repair information acquiring unit 212 may be configured to acquire repair information of the first memory 1 based on the defect information of the first memory 1. The repair information storage unit 213 may be configured to store the repair information of the first memory 1 in a second memory 3.

In an exemplary embodiment, the test device 21 may further include: a second memory testing unit, configured to acquire defect information of the second memory by testing the second memory before testing the first memory; a second memory defect information storage unit, configured to store the defect information of the second memory; a second memory repair information acquiring unit, configured to acquire repair information of the second memory based on the defect information of the second memory; and a second memory repairing unit, configured to repair the second memory with the repair information of the second memory.

In an exemplary embodiment, the first memory and the second memory may belong to the same storage device.

In an exemplary embodiment, the storage device may further include a control chip, and the built-in self-test circuit may be provided in the control chip.

In an exemplary embodiment, the first memory and the second memory may be stacked vertically in sequence above or below the control chip.

In an exemplary embodiment, the storage device may further include a third memory, and the built-in self-test circuit may be provided in the third memory.

In an exemplary embodiment, the first memory, the second memory, and the third memory may be stacked vertically in sequence.

In an exemplary embodiment, the first memory and the second memory may belong to different storage devices, and types of the different storage devices may be the same or different.

In an exemplary embodiment, the test device 21 may further include: a third memory testing unit, configured to acquire defect information of a third memory by testing the third memory; a third memory repair information acquiring unit, configured to acquire repair information of the third memory based on the defect information of the third memory; and a third memory repair information storage unit, configured to store the repair information of the third memory in the second memory.

In an exemplary embodiment, the test device 21 may further include: a first repair information reading unit, configured to read the repair information of the first memory and the third memory from the second memory; and a first memory repairing unit, configured to repair the first memory based on the repair information of the first memory, and repair the third memory based on the repair information of the third memory.

In an exemplary embodiment, the test device 21 may further include: a second repair information reading unit, configured to read the repair information of the first memory from the second memory; and a second memory repairing unit, configured to repair the first memory based on the repair information of the first memory.

In an exemplary embodiment, the test device 21 may further include: a third memory testing unit, configured to acquire defect information of a third memory by testing the third memory; a third memory repair information acquiring unit, configured to acquire repair information of the third memory based on the defect information of the third memory; and a third memory repair information storage unit, configured to store the repair information of the third memory in the first memory.

In an exemplary embodiment, the test device 21 may further include: a test data acquiring unit, configured to acquire test data of the first memory; and a test data storage unit, configured to store the test data of the first memory in the second memory.

Further, an embodiment of the present disclosure also provides an electronic device. The electronic device may include one or more processors and a storage device for storing one or more programs. The one or more programs, when executed by the one or more processors, cause the one or more processors to implement the method described in the above embodiments.

Further, an embodiment of the present disclosure also provides a computer-readable storage medium having a computer program stored thereon. The program, when executed by a processor, causes the processor to implement the method as described in the above embodiments. Other content may be made reference to the above method embodiments.

Those skilled in the art may easily conceive of other embodiments of the present disclosure after considering the description and practicing the invention disclosed herein. The present application is intended to cover any variations, uses, or adaptive changes of the present disclosure, and these variations, uses, or adaptive changes follow the general principles of the present disclosure and include common knowledge or conventional technical means in the technical field that are not disclosed in the present disclosure. The description and the embodiments are only regarded as exemplary, and the actual scope and spirit of the present disclosure are defined by the appended claims.

What is claimed is:

1. A memory test method, the method being executed by a built-in self-test circuit and comprising:
    acquiring defect information of a first memory by testing the first memory, acquiring repair information of the first memory based on the defect information of the first memory, and storing the repair information of the first memory in a second memory;
    acquiring defect information of a third memory by testing the third memory, acquiring repair information of the third memory based on the defect information of the third memory, and storing the repair information of the third memory in the second memory;
    reading the repair information of the first memory and the repair information of the third memory from the second memory; and repairing the first memory based on the repair information of the first memory, and repairing the third memory based on the repair information of the third memory; and
    testing the first memory and the third memory again until it is confirmed that the first memory and the third memory are repaired successfully.

2. The memory test method according to claim 1, wherein before testing the first memory, the method further comprises:
    acquiring defect information of the second memory by testing the second memory;
    storing the defect information of the second memory;
    acquiring repair information of the second memory based on the defect information of the second memory; and
    repairing the second memory with the repair information of the second memory.

3. The memory test method according to claim 1, wherein the first memory and the second memory belong to a same storage device.

4. The memory test method according to claim 3, wherein the storage device further comprises a control chip, and the built-in self-test circuit is provided in the control chip.

5. The memory test method according to claim 4, wherein the first memory and the second memory are stacked vertically in sequence above or below the control chip.

6. The memory test method according to claim 3, wherein the built-in self-test circuit is provided in one of the first memory, the second memory or the third memory.

7. The memory test method according to claim 6, wherein the first memory, the second memory, and the third memory are stacked vertically in sequence.

8. The memory test method according to claim 1, wherein the first memory and the second memory belong to different storage devices, and types of the different storage devices are the same or different.

9. The memory test method according to claim 1, further comprising:
    acquiring test data of the first memory; and
    storing the test data of the first memory in the second memory.

10. A memory test method, the method being executed by a built-in self-test circuit and comprising:
    acquiring defect information of a first memory by testing the first memory, acquiring repair information of the first memory based on the defect information of the first memory, storing the repair information of the first memory in a second memory, reading the repair information of the first memory from the second memory, and repairing the first memory based on the repair information of the first memory; and
    acquiring defect information of a third memory by testing the third memory, acquiring repair information of the third memory based on the defect information of the third memory, storing the repair information of the third memory in the first memory, reading the repair information of the third memory from the first memory, and repairing the third memory based on the repair information of the third memory.

11. A memory test device, the memory test device being provided in a built-in self-test circuit and comprising:
    a defect information acquiring circuit, configured to acquire defect information of a first memory by testing the first memory;
    a repair information acquiring circuit, configured to acquire repair information of the first memory based on the defect information of the first memory;
    a repair information storage circuit, configured to store the repair information of the first memory in a second memory;
    a first repair information reading circuit, configured to read the repair information of the first memory from the second memory;
    a first memory repairing circuit, configured to repair the first memory based on the repair information of the first memory;
    a memory testing circuit, configured to acquire defect information of a third memory by testing the third memory;
    a memory repair information acquiring circuit, configured to acquire repair information of the third memory based on the defect information of the third memory;
    a memory repair information storage circuit, configured to store the repair information of the third memory in the first memory;
    a second repair information reading circuit, configured to read the repair information of the third memory from the first memory; and
    a second memory repairing circuit, configured to repair the third memory based on the repair information of the third memory.

* * * * *